United States Patent [19]
Oikari et al.

[11] Patent Number: 5,861,064
[45] Date of Patent: Jan. 19, 1999

[54] PROCESS FOR ENHANCED PHOTORESIST REMOVAL IN CONJUNCTION WITH VARIOUS METHODS AND CHEMISTRIES

[76] Inventors: James R. Oikari, 11783 Shannon Ct., Apt. 924, Eden Prairie, Minn. 55344; Erik D. Olson, 1847 Beckman Ave., Arden Hills, Minn. 55112

[21] Appl. No.: 819,670

[22] Filed: Mar. 17, 1997

[51] Int. Cl.$^6$ .............................. B08B 3/00; B08B 7/00; C23G 1/02; C23F 1/00
[52] U.S. Cl. ................... 134/26; 134/3; 134/33; 134/36; 134/22.15; 216/2
[58] Field of Search .................. 134/3, 18, 33, 134/26, 36, 22.15; 216/2

[56] References Cited

U.S. PATENT DOCUMENTS

| | | | |
|---|---|---|---|
| 3,869,313 | 3/1975 | Jones et al. | 134/73 |
| 3,900,337 | 8/1975 | Beck et al. | 134/3 |
| 3,990,462 | 11/1976 | Elftmann et al. | 134/102 |
| 4,296,146 | 10/1981 | Penn | 427/58 |
| 4,609,575 | 9/1986 | Burkman et al. | 427/426 |
| 4,682,615 | 7/1987 | Burkman et al. | 134/102 |
| 4,778,536 | 10/1988 | Grebrinkski et al. | 134/36 |
| 4,782,032 | 11/1988 | Geissberger et al. | 437/41 |
| 4,965,218 | 10/1990 | Geissberger et al. | 437/41 |
| 5,151,375 | 9/1992 | Kazerounian et al. | 437/43 |
| 5,164,049 | 11/1992 | Clark et al. | 203/40 |
| 5,190,887 | 3/1993 | Tang et al. | 437/43 |
| 5,294,570 | 3/1994 | Flemming et al. | 437/239 |
| 5,393,686 | 2/1995 | Yeh et al. | 437/45 |
| 5,443,998 | 8/1995 | Meyer | 437/241 |
| 5,565,029 | 10/1996 | Takasu | 117/1 |
| 5,634,980 | 6/1997 | Tomita et al. | 134/3 |

FOREIGN PATENT DOCUMENTS

| | | | |
|---|---|---|---|
| 0 305 946 A2 | 3/1989 | European Pat. Off. | G03F 7/26 |
| 0 416 126 A1 | 3/1991 | European Pat. Off. | C23F 1/24 |
| 0 477 504 A1 | 4/1992 | European Pat. Off. | H01L 21/306 |
| 0 504 431 A1 | 9/1992 | European Pat. Off. | H01L 21/027 |
| 0 618 611 A2 | 10/1994 | European Pat. Off. | |

OTHER PUBLICATIONS

Mercury Spray Processing Systems Brochure FSI International, 1995.
Patent Abstracts of Japan 56046535.
Patent Abstracts of Japan 04125927.
Japio Abstract 03777641 abstracting JP 4142741 (May 15, 1992).
Japio Abstract 03473417 abstracting JP 3136317 (Jun. 11, 1991.
Japio Abstract 03357846 abstracting JP 3020746 (Jan. 29, 1991).
Japio Abstract 00941280 abstracting JP 57091580 (Jun. 7, 1982).
Japio Abstract 02009738 abstracting JP 61223838 (Oct. 4, 1986).
Mercury® MP Spray Processing System Data Sheet, FSI International (1995).

*Primary Examiner*—Susan A. Loring
*Attorney, Agent, or Firm*—Vidas, Arrett & Steinkraus, P.A.

[57] ABSTRACT

A novel method is disclosed for the removal of organic material, particularly hardened photoresist, from the surface of a substrate. Layers of organic material are removed using at least two treatment cycles, each of which includes the steps of a) applying an acid-containing composition, optionally mixed with an oxidizer, to the substrate surface, and then b) applying water to the substrate surface. The process is characterized by higher temperature spikes, shorter process times and lower chemical usage than is obtained with conventional photoresist stripping methods which do not employ repetitious treatments. The method may be practiced with spray processing equipment.

21 Claims, No Drawings

5,861,064

PROCESS FOR ENHANCED PHOTORESIST REMOVAL IN CONJUNCTION WITH VARIOUS METHODS AND CHEMISTRIES

BACKGROUND OF THE INVENTION

In the process of manufacturing semiconductors and other small components, it is often necessary to remove organic materials which may be on the surface of the semiconductor substrate or small component. These organic materials may arise from a variety of sources including, but not limited to, photoresist materials that have been applied to the substrate in the manufacturing process. Photoresist materials, in particular those that have been polymerized or otherwise hardened by deep ultraviolet exposure, oven baking, ashing, plasma hardening and ion implant hardening, can be especially difficult to remove.

A number of methods for removing organic contaminants such as photoresist are known in the art. The methods may be categorized in into dry methods and wet methods.

The dry methods include plasma based processes. Examples of plasma based etching include U.S. Pat. No. 4,296,146 to Penn wherein a flame operating as a plasma containing ionic species and monoatomic oxygen chemically decompose photoresist material. EP 0 305 946 A2 discloses a method of removing organic film by dry plasma ashing. U.S. Pat. No. 5,393,686 to Yeh et al. discloses, inter alia, the use of oxygen plasma ashing to remove photoresist. The plasma techniques, while reliable, require much time and complex apparatus to effectuate. Moreover, they pose the risk of ion generation in oxide layers due to electron bombardment, a problem in particular in FET components.

The wet methods are varied. Some methods involve the use of solvents to solubilize the organic contaminant while other methods involve the use of acids to chemically degrade the organic contaminant. As an example of the latter, U.S. Pat. No. 3,900,337 to Beck et al. discloses a method for stripping layers of organic material using mixtures of sulfuric acid and peroxide. The sulfuric acid and peroxide are mixed in specific quantities to exploit the dehydrating effect of the sulfuric acid and the oxidizing effect of the peroxide. The substrate containing the organic material is immersed in a bath of the mixture. The process may include several sequential baths where the sulfuric acid:peroxide ratio is varied.

Other examples include U.S. Pat. No. 4,778,536 to Grebinski, EP 0 504 431 A1, and EP 0 416 126 A1. Grebinski discloses and the use of superheated water vapor and sulfur trioxide vapor to strip photoresist, followed by a rinse with high purity/high pressure water vapor. EP 0 504 431 A1 uses a process liquid such as sulfuric acid/hydrogen peroxide or alternatively a dry removal method, followed by treatment of the substrate in a water solution in which ozone has been introduced. Finally, EP 0 416 126 A1 discloses the use of a fluoroalkyl based surfactant in conjunction with a sulfuric acid (or sulfuric acid-hydrogen peroxide) composition.

The above wet processes, however, all involve immersion of the substrate in cleaning baths. As is typical with such system, the cleaning fluid becomes contaminated over time, posing the threat of contaminating the substrates that are meant to be cleaned. Moreover, as the solution is contaminated over time, the cleaning chemicals are depleted, leading to longer and potentially unpredictable cleaning times.

SUMMARY OF THE INVENTION

It is an object of this invention to develop a cleaning method that is not subject to the drawbacks of the standard wet processes and yet capable of removing organic contaminants that are difficult to remove. It is a further object of this invention to develop a cleaning method that minimizes the use of cleaning agents and that minimizes damage to the process equipment.

These objects are achieved via the novel method disclosed herein for the removal of organic material including photoresist from the surface of a substrate. Layers of organic material are removed using at least two treatment cycles, each of which includes the steps of a) applying an acid-containing composition, optionally mixed with an oxidizer, to the substrate surface, and then b) applying water to the substrate surface. The process is characterized by higher temperature spikes, shorter process times and lower chemical usage than is obtained with conventional photoresist striping methods which do not employ repetitious treatments. The method is especially suited for practice in spray processor equipment.

DETAILED DESCRIPTION OF THE INVENTION

The invention is based on the discovery that the required total process time for a photoresist removal process using wet acid chemistries to completely remove the photoresist material can be significantly shortened if exposure to acid and rinse water is provided in multiple repeating short-time cycles.

The shortened process time is advantageous, both because of the increased manufacturing productivity it permits and because the effective life of vulnerable components of the process equipment, as measured by the number of substrates processed before failure, is effectively extended. This is due in part to the reduced total chemical exposure per substrate which the inventive process entails. However, an even greater extension of process equipment life is possible in certain embodiments of the invention because the invention also allows substantial reduction in the use of an oxidizer with the acid component. In many cases the oxidizer can be eliminated from the acid after the first or second treatment cycle, and in some cases it can be entirely eliminated from the process. This makes the inventive process much less aggressive toward process equipment, and also saves chemical costs for the treatment process.

The invention is preferably implemented using a spray processor. Spray processors capable of handling the chemicals involved in the process of the invention are described in U.S. Pat. No. 3,990,462, U.S. Pat. No. 4,609,575, and U.S. Pat. No. 4,682,615, all incorporated herein by reference, and are commercially available from FSI International, Chaska, Minn., under the MERCURY® trademark. In one design of such a spray tool a cassette containing a plurality of horizontally stacked, spaced wafer substrates is centrally mounted on a rotatable spindle in a process chamber which is provided with a side mounted vertically disposed spray post so that each wafer is sprayed across its surface as it is rotated. In another design several similar wafer bearing cassettes are mounted on a turntable and rotated around a central vertically disposed spray post. The spray effect is similar for both designs. Suitable plumbing and control systems are also provided so that spray solutions may be created as they are used from stock chemicals, the spray solutions can be varied according to a programmed sequence and cassette rotation rates may be varied as desired. In such processors, slow and fast rotation rates may be alternated to provide successive soak and spin sequences. Other spray processor designs are available from other manufacturers.

Spray processors have been used in the past with a single acid-oxidizer/water rinse cycle to remove photoresist, the process time being set to be sufficient to reliably remove all photoresist in the single process cycle.

While the invention is preferably implemented in a spray processor, it is also possible to obtain at least some of the advantages of the invention utilizing other liquid processing equipment, for instance using acid and rinse baths into which the substrate is successively and repeatedly dipped. Such baths may be provided with agitation or ultrasonics to more effectively implement the process.

In accordance with the conventional practice the acid containing component may be a mixture of sulfuric acid and an oxidizer or oxidizer solution. Suitable oxidizers include peroxides such as hydrogen peroxide, persulfates such as ammonium persulfate, and ozone. The sulfuric acid is suitably provided at a concentration of from 50% to about 98%, more preferably about 90% to about 96% by weight. The solution is suitably provided as a solution of 20–40%, more preferably about 30% by weight, of oxidizer in water. Ozone as an oxidizer may be employed as a solution or directly injected into the spray as a gas. The mixture of acid and oxidizer is preferably prepared fresh in the processor machine, just prior to dispensing, at a volume mixing ratio of from about 10:1 to about 1:1. The oxidizer and acid components may alternatively be simultaneously, but separately, dispensed from the processor spray post in a manner so as to cause mixing on, or on the way from the spray post to, the substrate provided that droplet size is maintained small enough and kinetic energy of the spray is high enough to assure complete mixing.

As an alternative to sulfuric acid, other strong mineral acids, for instance nitric acid, may be employed. Such acids may also be employed in mixture with sulfuric acid.

In some embodiments of the invention the oxidizer may be eliminated in some or all of the acid component treatment cycles. In particular it appears that even with hard baked or ion implanted photoresist, oxidizer is only required to facilitate initial penetration of a thin shell layer on the photoresist. After the shell layer is removed, the remaining photoresist in most cases is readily removed with successive treatments of sulfuric acid and water, without oxidizer. For photoresists without a hard shell the oxidizer can sometimes be eliminated from all acid component treatment cycles.

In a typical photoresist application using a spray processor, the initial acid component treatment will run for a period of from about 15 seconds to about 5 minutes, after which the substrate is sprayed with water, typically for a period of about 5 seconds to about 2 minutes. Subsequent cycles will typically employ an acid component spray for a period of about 10 seconds to about 2 minutes followed by a water spray for a period of about 5 seconds to about 1 minute. Variations outside these time periods can be employed, but in most cases will not be desirable because they may extend total process time required to fully remove the photoresist.

While spraying the acid component it is also desirable to vary the rotation rate of the substrate carrier, initially providing a slow rate, for instance 5–40 rpm, typically about 20 rpm and subsequently increasing the rotation rate gradually or step-wise, to a speed which will effectively throw off any material loosened by the treatment from the substrate surface. Such a high rate may be from about 100 rpm to about 500 rpm or even higher, with about 200 rpm being generally suitable for most applications. The water spray may also employ a similar variable rotation rate but typically fully satisfactory results can be obtained with a constant intermediate rotation rate, for instance of about 60 rpm.

The acid component temperature is suitably sprayed at a temperature from about 20° C. to as high as safely employed without danger to the operator or equipment. Typically the highest temperature considered safe is about 95° C., and it is preferred to spray the acid at that temperature. The water spray can be sprayed at a temperature of from about 10° C. to 100° C. For most applications a water temperature of about 85° C. to about 95° C. is preferred.

The number of repetitions of the acid component and water rinse cycles will vary depending on such factors as the thickness and type of photoresist, the specific concentration of acid, whether, for how many cycles and at what concentration oxidizer is used, the cycle times and the temperatures of acid component and water employed. Using preferred concentrations, temperatures and times as described herein a typical process for removal of a photoresist of about $1 \propto 2$ $\mu$m thick will require about 2–4 process cycles, of which the first utilizes oxidizer in the acid component and the remaining use only a concentrated sulfuric acid spray.

Because the method involves many rinses, this method is particularly well suited for removing photoresists which have polymerized or otherwise hardened, such as deep ultraviolet exposed, oven baked, post ashing, plasma hardened and ion implant hardened photoresist material.

The method is also expected to be advantageous for stripping organic material on semiconductor such as field effect transistors because the chemicals involved do not contain any metal ions and are rinsed off completely via the water rinse.

Without being bound to a particular mechanism, it is thought that the methods described herein function by a similar mechanism. Once the initial layer of organic contaminant such as hardened photoresist is removed, the hot water soaks into the contaminant much as water soaks into a sponge. When the acid is next applied to the substrate, an exothermic reaction takes place between the acid and the water. As a result of the heat evolved, some of the water that was adsorbed into the contaminant may turn to steam. This is supported by observations of substrate temperature spikes in excess of 100° C., up to as high as 160° C. during the second and subsequent applications of acid in the practice of the inventive process. It is believed that the increase in volume associated with steam formation serves to break up the surrounding photoresist, leading to a much more effective removal mechanism than is obtained by simply spraying hot concentrated acid without intervening water rinses. It is also possible that the heat of dissolution of the sulfuric acid may raise the temperature of the photoresist above that of the acid itself to a point that it is more easily chemically or thermally degraded.

EXAMPLES

In all examples photoresist of about 1–1.5 $\mu$m thickness was hard baked on a silicon substrates at 120° C. for 30 minutes. Thereafter, the substrates were exposed to a deep ultraviolet lamp and subjected to an $1E^{14}$ ions/cm$^2$ As$^+$ ion implant. The extent of removal of photoresist was determined by a visual inspection. The substrates were treated in an FSI MERCURY® spray processor, Model MP, available from FSI International, Chaska, Minn.

The stripping processes described below all included the following steps, in which step number 2, the chemical treatment step, was the only variable:

1) spray with 95° C. water for 2 minutes followed by a 1 minute spin dry;

2) chemical treatment process as described in individual examples;
3) spray with 95° C. water for 5 minutes to rinse;
4) spray with cold water (about 20° C.) for 3.5 min;
5) spin dry for 6 min at 500 rpm;
6) 0.5 min to stop rotation.

Invention Example

The chemical treatment process (step 2, above) began by spraying the substrate wafers for 130 seconds with a mixture of sulfuric acid (96%) and hydrogen peroxide solution (30%), mixed at a ratio of 8:1 by volume. For the first 100 seconds, the substrate was rotating at a rate of 20 rpm. For the remaining 30 seconds the rotation rate was increased to 200 rpm. Thereafter, a cycle consisting of a 30 second spray with hot water at a temperature of 90° C. followed by a 90 second spray with sulfuric acid was repeated three times. During the 30 second water spray, the substrate rotated at 60 rpm. During the 90 second sulfuric acid spray, the substrate rotated at 20 rpm for the first 60 seconds and at 200 rpm for the remaining 30 seconds. The process then moved to the hot water rinse step 3, described above. Total time for the chemical treatment process, step 2, was 8 min 10 seconds, of which only 6 min 40 sec involved spraying acid-containing composition. The total time for the entire sequence of steps 1–6, above, was 26 minutes 10 seconds. The flow rate of the spray was such that the total chemical usage (acid and peroxide) was 5.55 liters. The photoresist had been fully stripped at the end of the process.

Comparative Example 1
Continuous spray, comparable chemical usage.

The chemical treatment process involved continuously spraying the substrate wafers for 5 minutes 40 seconds with a mixture of sulfuric acid (96%) and hydrogen peroxide solution (30%), mixed at a ratio of 8:1 by volume. The wafers were rotated initially for 190 seconds at a rate of 20 revolutions per minute (rpm) followed by 20 seconds at 200 rpm and 130 seconds at 20 rpm. The process then moved to the hot water rinse step 3, described above. Total time for the entire sequence of steps 1–6, above, was 23 minutes and 40 seconds. No stripping was observed. The total chemical usage was 5.1 liters.

Comparative Example 2
Continuous spray, high chemical usage.

A silicon substrate containing photoresist was subject to a spray of a mixture of sulfuric acid and peroxide of the same composition as in the first spray sequence of the Invention Example. The substrate was sprayed continuously throughout the step 2 chemical treatment process. The time of the step 2 process was 14 minutes 10 seconds. The cartridge was rotated initially for 280 seconds at a rate of 20 revolutions per minute (rpm) followed by 30 seconds at 200 rpm, 240 seconds at 20 rpm, 30 seconds at 200 rpm and 120 seconds at 20 rpm. Total time for the entire sequence of steps 1–6, above, was 32 minutes and 10 seconds. At the end of the process the photoresist had been stripped. The total chemical usage was 12.75 liters.

From these examples it can be seen that even though the acid spray was repeatedly interrupted, both the total time to remove the photoresist and the total chemical usage was reduced by the inventive process.

The present disclosure is an exemplification of the principles of the invention and is not intended to limit the invention to the particular embodiments illustrated. Those skilled in the art may recognize other equivalents to the specific embodiments described herein which equivalents are intended to be encompassed by the claims attached hereto.

What is claimed is as follows:

1. A method for stripping organic material from the surface of a substrate comprising subjecting the substrate to at least two consecutive treatments, each treatment, comprising the following steps:
   a) spraying a liquid strong acid-containing composition onto the surface of the substrate; and then
   b) spraying water onto the surface of the substrate;
   said treatments being continued consecutively until the organic material is removed from the surface of the substrate,
   wherein in at least one of said treatments, the acid-containing composition as applied to the substrate is free of peroxide compounds, persulfate compounds and ozone.

2. The method of claim 1 wherein said organic material is a layer of photoresist material.

3. The method of claim 2 wherein said photoresist material is selected from the group consisting of deep ultraviolet exposed, oven baked, post ashed, plasma hardened and ion implant hardened photoresist material.

4. The method of claim 1 wherein in one or more of said treatments the strong acid-containing composition further comprises an oxidizer component selected from the group consisting of peroxide compounds, persulfate compounds and ozone.

5. The method of claim 4 wherein the strong acid is sulfuric acid and the oxidizer component is hydrogen peroxide.

6. The method of claim 5 wherein in the treatment steps wherein the acid-containing composition comprises hydrogen peroxide, the concentration of the sulfuric acid is between 50 and 98 percent, the concentration of the hydrogen peroxide is 20 to 40 percent and the volume ratio of the sulfuric acid to the hydrogen peroxide in said mixture ranges from 10:1 to 1:1.

7. The method of claim 1 wherein the water applied during the steps b) is at a temperature between 10° C. and 100° C.

8. The method of claim 7 wherein the water temperature is 85°–95° C.

9. The method of claim 1 wherein in each step a), the acid-containing composition is applied by spraying for intervals of from about 10 seconds to about 5 minutes and in each step b) the water in the pretreatment step is applied by spraying for about 5 seconds to about 2 minutes.

10. The method of claim 1 wherein during a second or subsequent said treatment, the substrate achieves a temperature of 100° C. to about 160° C. while the sulfuric acid is applied during step a) of said treatment.

11. The method of claim 1 wherein the substrate is mounted on a cartridge that rotates past a spray post from which the acid-containing composition and water are sprayed, respectively during said steps a) and b).

12. The method of claim 1 wherein the acid-containing composition comprises sulfuric or nitric acid.

13. The method of claim 1 wherein the acid-containing composition consists of concentrated sulfuric acid in at least some of said treatments.

14. The method of claim 1 wherein the acid-containing composition in each of said treatments is free of an oxidizer component.

15. A method for stripping organic material from the surface of a substrate comprising a) preparing a mixture product composition of a strong acid and an oxidizer component, the oxidizer being selected from the group consisting of peroxide compounds, persulfate compounds and ozone, and b) subjecting the substrate to at least two consecutive treatments, each treatment, comprising the following steps:
  i) spraying said mixture product composition onto the surface of the substrate; and then
  ii) spraying water onto the surface of the substrate;

said treatments being continued consecutively until the organic material is removed from the surface of the substrate.

16. The method of claim 15 wherein the strong acid is sulfuric acid and the oxidizer component is hydrogen peroxide.

17. The method of claim 16 wherein the concentration of the sulfuric acid is between 50 and 98 percent, the concentration of the hydrogen peroxide is 20 to 40 percent and the volume ratio of the sulfuric acid to the hydrogen peroxide in said mixture ranges from 10:1 to 1:1.

18. The method of claim 15 wherein the water sprayed during the steps b)ii) is at a temperature of at least 85° C.

19. The method of claim 15 wherein during a second or subsequent said treatment step b), the substrate achieves a temperature of 100° C. to about 160° C. while the sulfuric acid is applied during step b)i) of said treatment.

20. The method of claim 15 wherein the strong acid is sulfuric acid, nitric acid or a mixture thereof.

21. The method of claim 15 wherein the organic material is photoresist material selected from the group consisting of deep ultraviolet exposed, oven baked, post ashed, plasma hardened and ion implant hardened photoresist material.

* * * * *

UNITED STATES PATENT AND TRADEMARK OFFICE
CERTIFICATE OF CORRECTION

PATENT NO. : 5,861,064

DATED : January 19, 1999

INVENTOR(S) : James R. Oikari and Erik D. Olson

It is certified that error appears in the above-identified patent and that said Letters Patent is hereby corrected as shown below:

Column 4, line 18, delete "∝" and insert -- — --.

Signed and Sealed this

Thirteenth Day of July, 1999

Attest:

Q. TODD DICKINSON

Attesting Officer

Acting Commissioner of Patents and Trademarks

UNITED STATES PATENT AND TRADEMARK OFFICE
CERTIFICATE OF CORRECTION

PATENT NO. : 5,861,064

DATED : January 19, 1999

INVENTOR(S) : James R. Oikari and Erik D. Olson

It is certified that error appears in the above-identified patent and that said Letters Patent is hereby corrected as shown below:

Title page, item [73]
insert --Assignee: FSI International, Inc., Chaska, Minn--.

Signed and Sealed this

Seventh Day of March, 2000

*Attest:*

Q. TODD DICKINSON

*Attesting Officer*  *Commissioner of Patents and Trademarks*